(12) United States Patent  
Yokoyama et al.

(10) Patent No.: US 7,053,426 B2  
(45) Date of Patent: May 30, 2006

(54) SEMICONDUCTOR DEVICE WITH HEAT SINK

(75) Inventors: Ryoichi Yokoyama, Ogaki (JP); Koji Yamano, Hirakata (JP); Yasuhiro Takeda, Ogaki (JP); Koji Hirosawa, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/953,070

(22) Filed: Sep. 30, 2004

(65) Prior Publication Data

US 2005/0110132 A1 May 26, 2005

(30) Foreign Application Priority Data

Sep. 30, 2003 (JP) .............................. 2003-340653

(51) Int. Cl.  
*H01L 29/80* (2006.01)

(52) U.S. Cl. ...................... 257/276; 257/625; 257/675; 257/706; 257/720

(58) Field of Classification Search ................... None  
See application file for complete search history.

(56) References Cited

U.S. PATENT DOCUMENTS 5,233,211 A * 8/1993 Hayashi et al. ............. 257/347  
5,605,847 A * 2/1997 Zhang ......................... 438/164  
5,658,806 A * 8/1997 Lin et al. ..................... 438/157

FOREIGN PATENT DOCUMENTS

JP 11-111998 4/1999

* cited by examiner

*Primary Examiner*—Andy Huynh  
(74) *Attorney, Agent, or Firm*—Morrison & Foerster LLP

(57) ABSTRACT

A semiconductor device includes a glass substrate, a heat sink formed on the glass substrate and a transistor formed on the heat sink. The transistor includes an active layer formed on the heat sink and having a source region, a channel region and a drain region. A gate electrode is placed on the channel region. In addition, the heat sink may operate as additional gate electrode.

14 Claims, 3 Drawing Sheets

SEMICONDUCTOR DEVICE WITH HEAT SINK

BACKGROUND OF THE INVENTION

1. Field of Invention

This invention relates to a semiconductor device, especially to a semiconductor device used as a power device.

2. Description of Related Art

A low temperature poly silicon thin film transistor (referred to as LTPS-TFT hereinafter) has been known as a TFT used in a pixel portion or peripheral circuits of a display device such as an LCD display device and an EL display device. The LTPS-TFT is a TFT having a poly-silicon that can be crystallized as an active layer at temperature low enough for a glass substrate. This TFT also has a high carrier-mobility. It is therefore suitable for a display device designed for driving and switching pixels formed a glass substrate.

Next, the configuration of the conventional LTPL-TFT will be explained by referring to FIG. 3, which is a cross-sectional view of the conventional LTPL-TFT. This figure only shows the configuration of the n-channel type TFT.

An insulating film 21 is formed on a glass substrate 20. An active layer 22 configured from low temperature poly silicon (poly-Si) is formed on the insulating film 21. A channel region 22c is formed between a source region 22s a drain region 22d of the active layer 22. The source region 22s and the drain region 22d each have an n+ layer with a high impurity concentration and an n− layer with a low impurity concentration, forming a LLD (lightly doped drain) configuration.

A gate electrode 24 is formed above the channel region 22c with a gate insulating film 23, which covers the active layer 22, between them.

An interlayer insulating film 25 is formed on the gate electrode 24 and the insulating film 23. A contact hole C2s is formed piercing the gate insulating film 23 and the interlayer insulating film 25 at the location corresponding to the source region 22s, and a source electrode 26s fills hole. Also, a contact hole C2d is formed piercing the gate insulating film 23 and the interlayer insulating film 25 at the location corresponding to the drain region 22d, and a drain electrode 26d fills the hole.

A passivation layer 27 that flattens and protects the surface of the TFT is formed on the area above the interlayer insulating film 25 including the areas above the source electrode 26s and the drain electrode 26d. The related technology is disclosed, for example, in Japanese Patent Application Publication No. 11-111998.

However, Joule heat is generated at the channel region 22c in the high resistance area during the electric current driving in the conventional LTPS-TFT when a large amount of electric current is applied, that is, when the TFT is used as a power device. The TFT is heated up from Joule heat, lowering the Ids and changing its threshold value and leading to the deterioration of the TFT quality.

Therefore, this invention is directed to a LTPS-TFT that can accommodate a large amount of electric current and prevent the quality deterioration from the heat during the application of the electric current driving.

SUMMARY OF THE INVENTION

The invention provides a semiconductor device that includes a glass substrate, an active layer formed on the glass substrate and having a source region, a channel region and a drain region, a gate electrode disposed on the channel region, and a metal layer disposed between the substrate and the channel region so that heat generated at the channel region is absorbed by the metal layer.

The invention also provides a semiconductor device that includes a glass substrate, a heat sink disposed on the glass substrate, an active layer formed on the heat sink and having a source region, a channel region and a drain region, and a gate electrode disposed on the channel region.

A bottom metal layer as a heat sink is formed underneath of the active layer (at least, underneath of the channel region) of the TFT in this invention. This makes Joule heat generated around the channel region during the electric current driving discharged easily from the TFT, preventing the quality deterioration of the TFT due to the heat.

Also, Joule heat in stored in the TFT is effectively discharged by connecting the bottom metal layer to the gate electrode or the source region.

When the bottom metal layer is connected to the gate electrode, the effective discharge of the heat is achieved, and the on-resistance can also be suppressed because of the dual-gate configuration. This makes it possible to achieve the power device with the minimum electricity loss. When the bottom metal layer is connected to the source region, the effective discharge of the heat is achieved, and the anti-pressure quality of the TFT can also be improved. This makes it possible to improve the reliability of the TFT during the application of the large amount of the electric current. Also, the manufacturing cost can be significantly suppressed, because the glass material can be used for substrate.

DETAILED DESCRIPTION OF THE INVENTION

Figure 1:
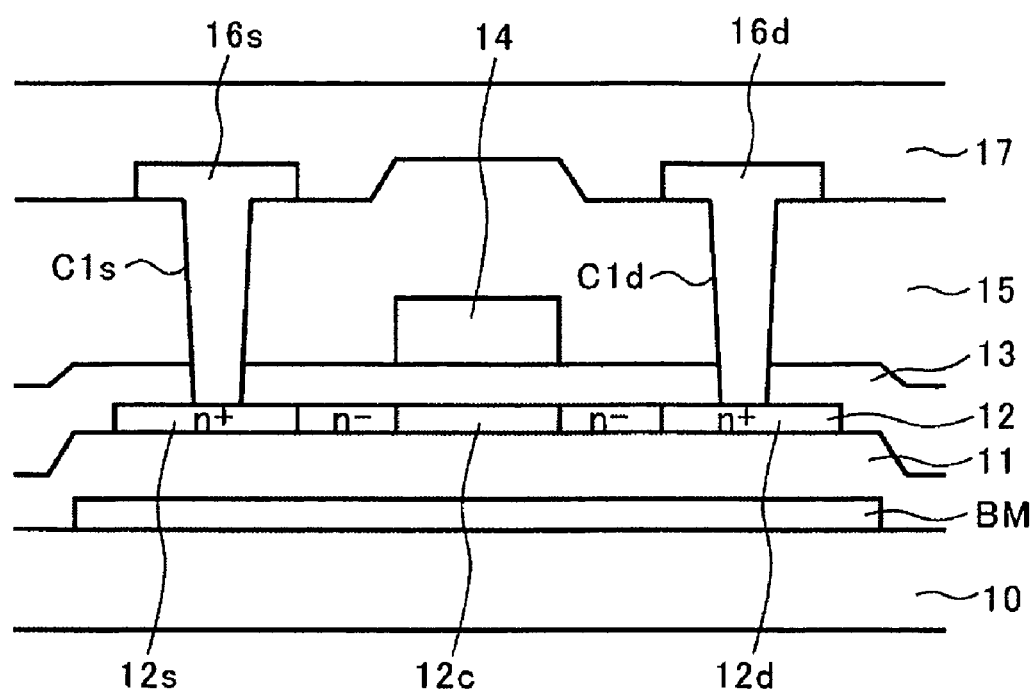
FIG. 1 is a cross-sectional view of an embodiment of the semiconductor device of this invention.

Next, an embodiment of the semiconductor device of this invention will be explained by referring to figures. FIG. 1 is a cross-sectional view of the embodiment of the semiconductor device of this invention, that is, the cross-sectional view of an LTPS-TFT. FIG. 1 only shows the configuration of the n-channel type TFT.

A bottom metal layer BM is formed on a glass substrate 10, which is a component of the LTPS-TFT, as shown FIG. 1. The bottom metal layer BM is a metal layer that functions as a heat sink discharging the heat from the TFT and has a certain level of thermal conductivity. The bottom metal layer can be formed by using, for example, chrome (Cr) as its material.

An insulating film 11 is formed on the bottom metal layer AM as well as the glass substrate 10. An active layer 12 is formed on the insulating film 11 at the location corresponding to the bottom metal layer BM. The active layer 12 is made of a low temperature poly silicon (poly-Si) that can be crystallized at a temperature which a glass substrate can withstand.

A channel region 12c is formed between a source region 12s and a drain region 12d of the active layer 12. Joule heat is generated during a drive of the device by a large amount of electric current at the channel region 12c since the channel region is a high resistance area. However, Joule heat is discharged outside of the channel region 12c by heat transfer to the bottom metal layer BM formed under the active layer 12.

The source region 12s and the drain region 12d each have an n+ layer with a high impurity concentration and an n– layer with a low impurity concentration, forming a LLD (lightly doped drain) configuration.

A gate electrode 14 is formed above the channel region 12c with a gate insulating film 13, which covers the active layer 12, between them.

An interlayer insulating film 15 is formed on the gate electrode 14 and the insulating film 13. A contact hole C1s is formed piercing the gate insulating film 13 and the interlayer insulating film 15 at the location corresponding to the source region 12s, and a source electrode 21s fills the hole. Also, a contact hole C1d is formed piercing the gate insulating film 13 and the interlayer insulating film 15 at the location corresponding to the drain region 12d, and a drain electrode 16d fills the hole.

A passivation layer 17 that flattens and protects the surface of the TFT is formed on the area above the interlayer insulating film 15 including the areas above the source electrode 16s and the drain electrode 16d.

The bottom metal layer BM is formed on the glass substrate 10 preferably underneath the entire area of the active layer 12 in the embodiment described above. However, this invention is not limited to this configuration. That is, the bottom layer BM may be formed on the glass substrate 10, only underneath the channel region 12c of the active layer 12. In this case, since only the channel region 12c of the active layer 12 has a corresponding bottom metal layer BM, the heat from the laser upon the crystallization of the active layer through laser anneal is discharged through the bottom metal layer to the side of the glass substrate, leading to a smaller degree of crystallization of the active layer (smaller diameter of the crystal at certain position). However, Joule heat generated at the channel region 12c, a high resistance area, during the LTPS-TFT drive can be discharged by heat transfer to the bottom metal layer BM.

The bottom metal layer BM as a heat sink is formed underneath the active layer 12 of the LTPS-TFT as mentioned above. This prevents the self heat-up of the TFT due to Joule heat, achieving the LTPS-TFT capable of accommodating a large amount of electric current.

Also, the LTPS-TFT of this embodiment includes the TFT with the configuration described below, in addition to the embodiment described above. That is, the bottom metal layer BM and the gate electrode 14 can be connected through a via-hole in the LTPS-TFT of this embodiment. In this case, the LTPS-TFT has a dual-gate configuration with two gates. That is, the bottom metal layer BM is configured to operate as another gate electrode and the insulating film 11 is configured to operate as another gate insulating film.

In this case, the discharge of Joule heat to outside of the TFT during electric current drive is more efficient, compared to the discharge of the heat by the bottom metal layer alone since the area of the metal layer functioning as a heat sink increases.

Additionally, the dual gate configuration further lowers the on-resistance of the TFT (the total of the resistance of the channel region 12c and the parasite resistance during the conduction). That is, the necessary voltage for getting a certain amount of driving electric current through is smaller compared to the case of a single gate configuration. Therefore, the consumption of electricity (electricity consumption=electric current×applied voltage) can be suppressed. The generation of Joule heat can also be suppressed. The dual gate configuration can not only suppress the influence of self heat-up due to Joule heat, but it can also achieve the LTPS-TFT accommodating the large amount of electric current with the minimum electric loss.

It is preferable that the insulating film 11 and the gate insulating film 13 has the same film thickness in the dual gate configuration of the LTPS-TFT, in order to achieve the ideal on-resistance. The carrier generated in the active layer 12 can ideally be doubled, making the transmission of the electricity easier under the condition in the film thickness described above. However, this invention is not limited to the film thickness described above. For example, the bottom metal layer BM may have a thickness of 100 nm, the insulating film 11 a thickness of 150 nm, the active layer 12 a thickness of 45 nm, the gate insulating film 13 a thickness of 100 nm, and the gate electrode a thickness of 200–300 nm can be formed.

Also, the bottom metal layer BM connected to the gate electrode 14 can be formed only on the glass substrate 10 located underneath the channel region 12c of the active layer 12. In this case, the response speed of the TFT can be improved since the parasite capacitance appearing in the bottom metal layer BM is suppressed.

On the other hand, when the discharge of Joule heat to outside of the TFT, not the response speed of the TFT, is the first priority, the bottom metal layer BM should be formed on the glass substrate 10 underneath the entire active layer 12, so that the area discharging Joule heat to outside of the TFT is broadened.

Also, the bottom metal layer BM can be connected to the source region 12s or the source electrode 16s instead of the gate electrode 14. The more effective discharge of Joule heat to outside of the TFT can be achieved, compared to the case where the bottom metal layer BM is not connected to other layer or other region, since the area of the metal layer functioning as the heat sink increases when the bottom metal layer BM is connected to the gate electrode 14. In this case, the TFT does not have a dual gate configuration. Therefore, the on-resistance is not lowered. However, the anti-voltage property against the voltage for driving the TFT is improved.

The n-channel type TFT is explained in the embodiment mentioned above. However, this invention is not limited to this configuration. That is, the LTPS-TFT of this invention can also be applied to a p-channel type LTPS-TFT where the source region 12s of the active layer 12 and the drain region 12d of the active layer 12 each have a p+ layer with a high impurity concentration and a p– layer with a low impurity concentration.

Figure 2A:
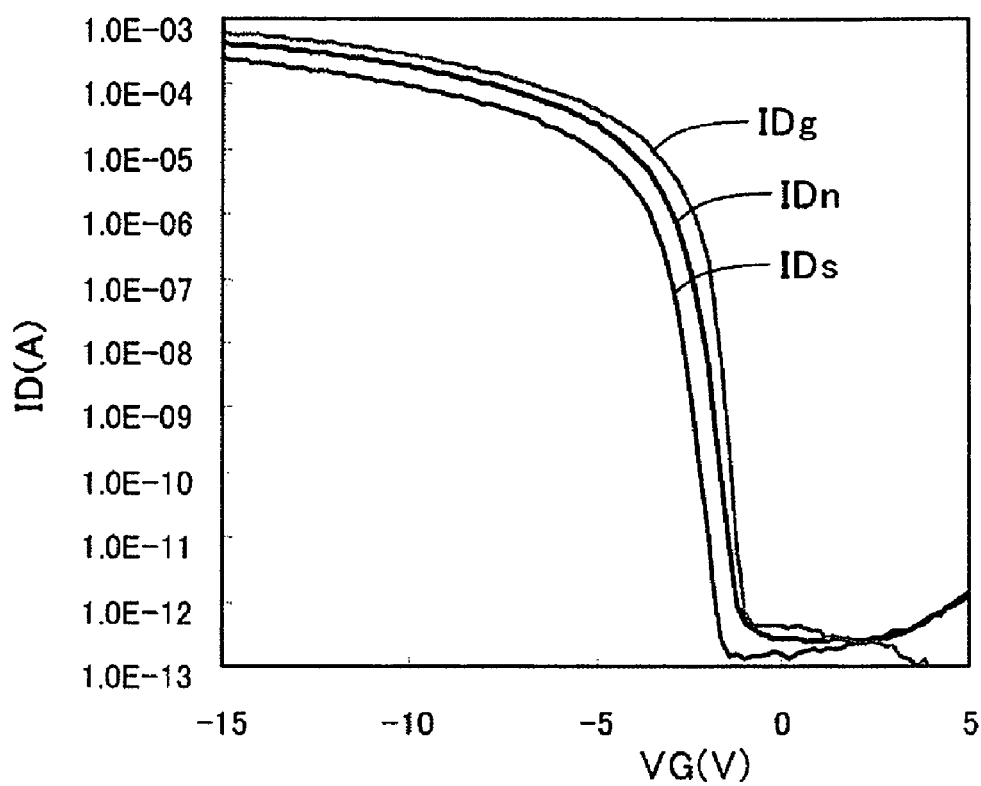
FIG. 2 shows characteristics the electric current as a function of the electric voltage of the semiconductor device of this embodiment.
Figure 2B:
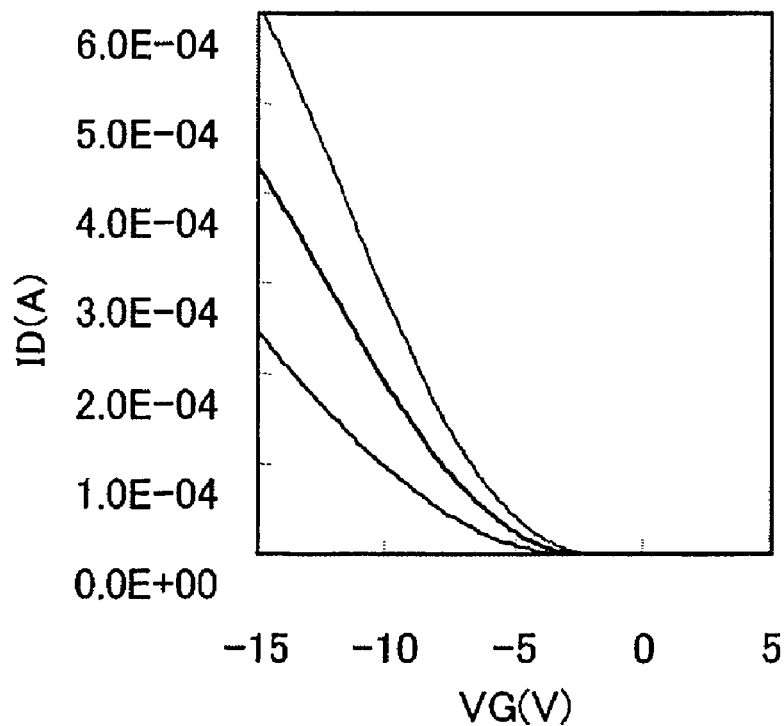
Figure 3:
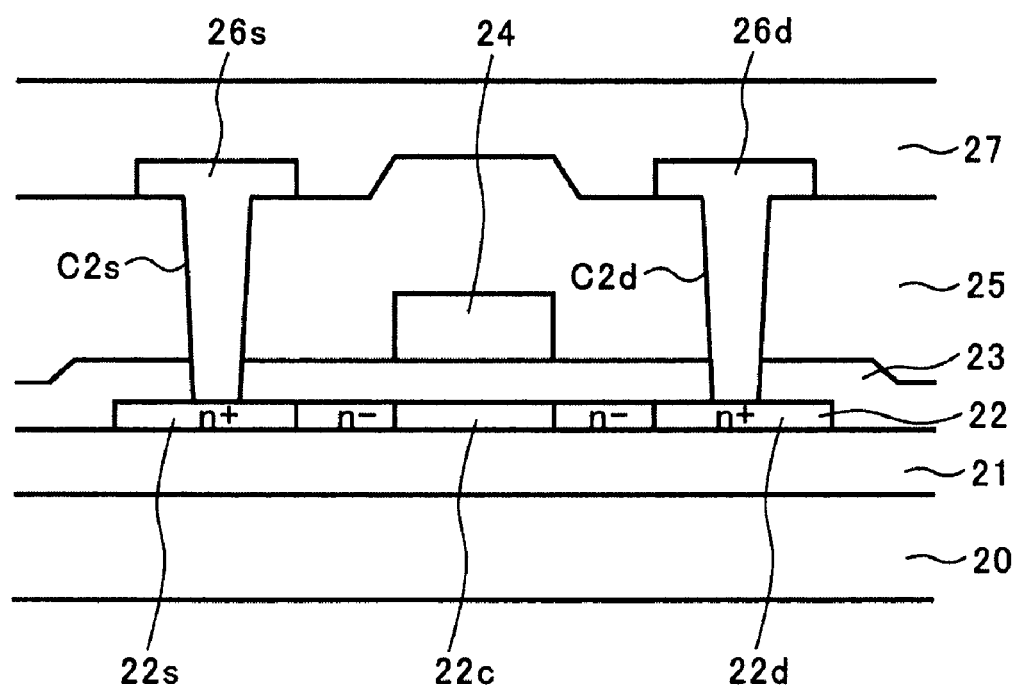
FIG. 3 is a cross-sectional view of a conventional semiconductor device.

Next, how on-resistance decreases in the LTPS-TFT with the dual gate configuration where the gate electrode 14 and the bottom metal layer BM is connected is explained by referring to FIG. 2. FIG. 2 shows the electric current-voltage property of the LTPS-TFT of this embodiment based on actual experiments. Although the experiments were performed on the p-channel type LTPS-TFT, the same result can be obtained from the n-channel type.

The vertical axis of the electric current-voltage property graph of FIG. 2 corresponds to the drain electric current ID [A] and the horizontal axis to the gate voltage VG [V]. Also, IDn shows the electric current-voltage property when the bottom metal layer BM is not connected to other layer or other region. IDg shows the electric current-voltage property when the same voltage as the gate voltage VG (the voltage applied to the gate electrode 14) is applied to the bottom metal layer BM connected to the gate electrode 14, that is, the electric current-voltage property when the gate electrode 14 and the bottom metal layer BM are used as the dual gate. IDs shows the electric current-voltage property when earth voltage (0 volt) is connected to the bottom metal layer BM connected to the source region 12s or the source electrode 16s.

The drain electric current IDg with the gate electrode 14 and the bottom metal layer BM used as the dual gate is bigger than the drain electric current IDn with the bottom metal layer BM not connected to other region or other layer when the gate voltage VG=−10 volts is applied to the gate electrode 14 as shown in FIG. 2. That is, the voltage for obtaining a certain level of driving electric current decreases, leading to the decreased on-resistance compared to the LTPS-TFT where the bottom metal layer BM is not connected to other region or other layer.

On the other hand, the drain electric current IDs with the bottom metal layer BM connected to the source region 12s or the source electrode 16s is smaller than the drain electric current IDn with the bottom metal layer BM not connected to other region or other layer when the earth voltage of 0 volt is applied to the bottom metal layer BM. That is, there is no effect for decreasing the on-resistance in this case.

The TFT explained in the embodiment described above has a top-gate configuration where the gate electrode 14 is formed on the active layer 12 through the gate insulating 13. However, this invention is not limited to this configuration. This invention is also applicable to the bottom-gate type TFT where the gate electrode is formed through the gate insulating film at the location corresponding to the channel region of the active layer 12 between the glass substrate and the active layer 12.

What is claimed is:

1. A semiconductor device comprising:
   a glass substrate;
   an active layer formed on the glass substrate and comprising a source region, a channel region and a drain region;
   a gate electrode disposed on the channel region; and
   a metal layer disposed between the substrate and the channel region so that heat generated at the channel region is absorbed by the metal layer,
   wherein the metal layer is connected to the gate electrode.

2. The semiconductor device of claim 1, wherein the metal layer covers the entire channel region.

3. The semiconductor device of claim 2, wherein the source region and the drain region each have a region of a high impurity concentration and a region of a low impurity concentration.

4. The semiconductor device of claim 1, wherein the metal layer covers the entire active layer.

5. The semiconductor device of claim 4, wherein the source region and the drain region each have a region of a high impurity concentration and a region of a low impurity concentration.

6. The semiconductor device of claim 1, wherein the source region and the drain region each have a region of a high impurity concentration and a region of a low impurity concentration.

7. A semiconductor device comprising:
   a glass substrate;
   an active layer formed on the glass substrate and comprising a source region, a channel region and a drain region;
   a gate electrode disposed on the channel region; and
   a metal layer disposed between the substrate and the channel region so that heat generated at the channel region is absorbed by the metal layer,
   wherein the metal layer is connected to the source region.

8. The semiconductor device of claim 7, wherein the metal layer covers the entire channel region.

9. The semiconductor device of claim 8, wherein the source region and the drain region each have a region of a high impurity concentration and a region of a low impurity concentration.

10. The semiconductor device of claim 7, wherein the metal layer covers the entire active layer.

11. The semiconductor device of claim 10, wherein the source region and the drain region each have a region of a high impurity concentration and a region of a low impurity concentration.

12. The semiconductor device of claim 7, wherein the source region and the drain region each have a region of a high impurity concentration and a region of a low impurity concentration.

13. A semiconductor device comprising:
    a glass substrate;
    a heat sink disposed on the glass substrate and made of chromium;
    an active layer formed on the heat sink and comprising a source region, a channel region and a drain region; and
    a gate electrode disposed on the channel region.

14. The semiconductor device of claim 13, wherein the heat sink is configured to operate as an additional gate electrode.

* * * * *